Jan. 3, 1956 H. S. HAYNES 2,729,790

PULSE CODE MODULATOR

Filed Jan. 2, 1952 2 Sheets-Sheet 1

INVENTOR
HERBERT S. HAYNES
BY Percy P. Lantzy
ATTORNEY

Jan. 3, 1956 H. S. HAYNES 2,729,790

PULSE CODE MODULATOR

Filed Jan. 2, 1952 2 Sheets-Sheet 2

INVENTOR
HERBERT S. HAYNES
BY
ATTORNEY

United States Patent Office 2,729,790

Patented Jan. 3, 1956

2,729,790

PULSE CODE MODULATOR

Herbert S. Haynes, Montclair, N. J., assignor to International Telephone and Telegraph Corporation, a corporation of Maryland Application January 2, 1952, Serial No. 264,618

9 Claims. (Cl. 332—1)

This invention relates to electrical transmission systems of the pulse type and more particularly to a means for generating a pulse code modulation signal from a frequency modulated signal.

Heretofore many methods of generating pulse code modulations have been employed. In some systems the signals are handled on an amplitude basis throughout the coder. In another class of systems, amplitude variations are translated into time variations during the coding process. The present invention is classified in still another class of systems where amplitude variations are translated into a frequency variation during the coding process.

Systems previously employed in this latter classification required that a pulse amplitude modulated signal, either plus or minus, be rectified by a full-wave rectifier and then stretched or lengthened approximately three times its original length. This rectified and lengthened pulse amplitude modulated signal would then be coupled to the proper electrode of a high frequency oscillator to produce a high frequency deviation. Heterodyning this output with a fixed frequency of a high frequency oscillator resulted in a desired steady state intermediate frequency and a desired peak swing for maximum level input. After suitable amplification of the pulsed FM signals, they would be fed into the digit networks to produce a cyclic progression code. These networks consist of adjustable pass or rejection band filters, in conformance with the requirements of the cyclic progression code, for each individual signal level contained in the aforementioned code. The individual digit network outputs are then rectified, delayed, and recombined to produce a pulse code modulation composite signal. For proper performance of such a system, a complexity of circuitry is necessitated, and a prolonged procedure of tuning is required. It is therefore an object of this invention to reduce the number of filter networks required to achieve generation of a pulse code modulation signal from a frequency modulated signal.

It is another object of this invention to reduce the overall complexity of pulse code modulation systems of the frequency modulated signal type and to provide a simple means of adjustment to obtain the desired results.

A feature of this invention is the employment of a plurality of crystal controlled oscillators of predetermined frequencies which are combined properly to heterodyne with the input FM signal for production of the successive digits to establish the code sequence.

Another feature of this invention is the requirement of only a single tuned circuit for each digit of the code regardless of the number of levels contained therein.

The above-mentioned and other features and objects of this invention and the manner of attaining them will be best understood by reference to the following description of an embodiment of the invention taken in conjunction with the accompanying drawings, wherein:

Fig. 3 is a representation of a cyclic progression code containing a plurality of digits for explanation of the operation of the uni-tuned circuit of Fig. 1 for handling a cyclic progression code of five digits.

The PCM modulator herein described comprises a frequency modulation signal source 1 and a coding circuit 2. Source 1 is employed to drive the coding circuit 2 to properly convert the FM signal therein to a PCM output. To accomplish this conversion, a uni-tuned circuit 15 converts the FM signal to a cyclic progression code, this code by means of a multivibrator is then converted to a PCM output. The term uni-tuned circuit hereinafter described has reference to a circuit which employs a single tuned circuit for each of the digits contained in a predetermined cyclic progression code, rather than employing a tuned circuit for each of the signal levels present in such a code.

Figure 1:
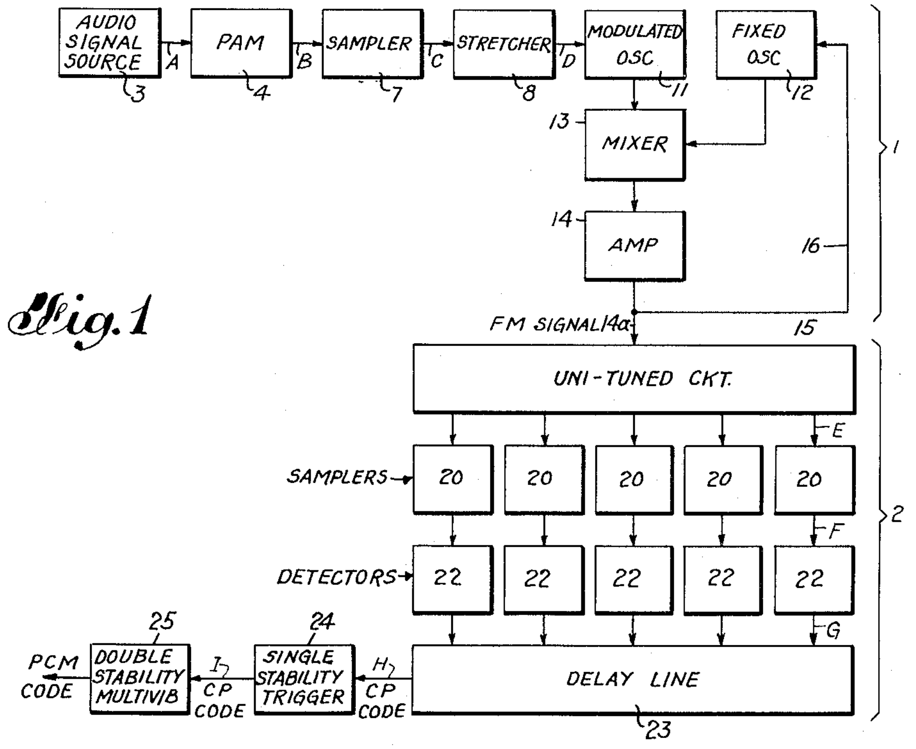
Fig. 1 is a block diagram illustrating a PCM coder according to the principles of this invention.
Figure 2:
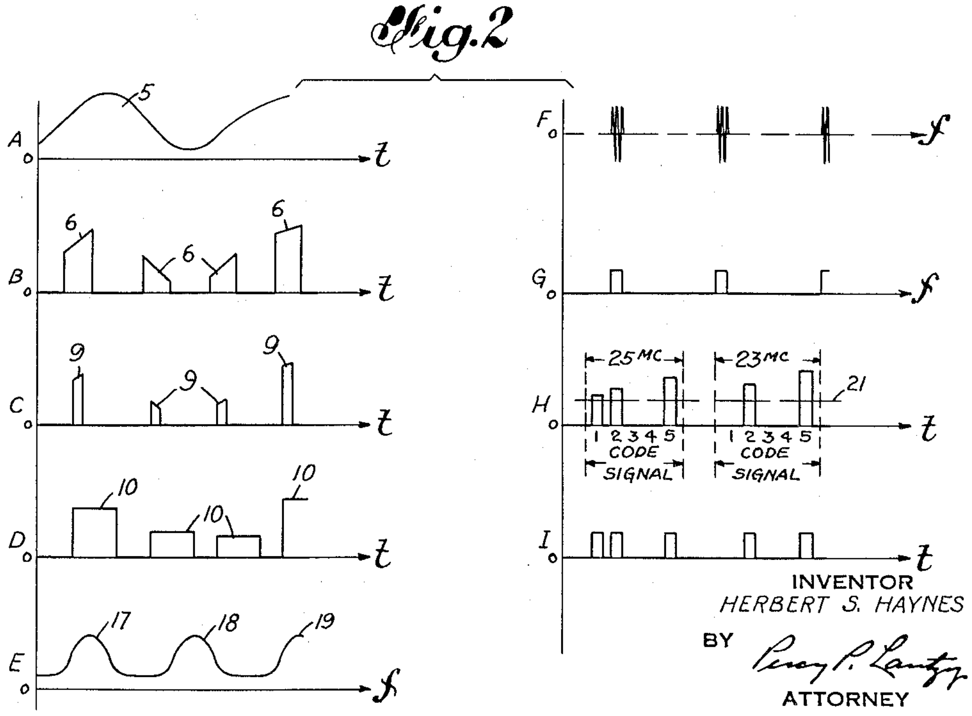
Fig. 2 illustrates the waveforms present at various points in the system of Fig. 1 indicating the coding process.

Referring to Figs. 1 and 2 of the drawing, the pulse code modulation coder FM signal source 1 is shown that comprises a source of audio signals 3, a short segment of the audio output of which is shown in curve A, Fig. 2. The pulse amplitude modulator 4 produces discrete pulses, as shown in curve B, Fig. 2, which vary in amplitude in accordance with the instantaneous amplitude of the signal wave 5. It is a requirement of all pulse code modulation coders that the top 6 of the discrete pulses have a slope of much less than one code signal level. To achieve this, it is necessary to employ a conventional sampler circuit 7 and a stretcher circuit 8. Sampler circuit 7 removes a portion of each pulse from the pulse amplitude modulator 4, as shown in curve C, Fig. 2, in order that the slope of top 9 is not excessive in accordance with the requirement hereabove mentioned, then through means of a condenser located in the stretcher circuit 8, which charges up for the desired length of time, the stretched pulses 10 are produced, curve D. The length or duration of the stretched pulses 10 is substantially three or four times greater than the sampled pulses 9, but may be any width depending upon the frequency deviation required. A further requirement of such a system as herein described is that the pulse amplitude modulation rate must be at least twice the highest audio modulating frequency present. The pulses 10 are used to frequency modulate a frequency oscillator 11 whose frequency is chosen to develop a linear deviation. The amount of frequency deviation required in such a system must be sufficient to allow operation of the succeeding low Q circuits therein for fast buildup and at the same time to obtain a bandwidth of the desired fraction of the total frequency range occupied.

Modulated oscillator 11 is heterodyned with a fixed frequency oscillator 12 by means of the mixer circuit 13 to obtain a desired intermediate frequency which is modulated in accordance with the aforementioned stretched pulse amplitude modulated pulse wherein a number of steady state cycles thereof are obtained during the time of one pulse 10. The modulated intermediate frequency signal 14 is amplified by the amplification circuit **14*a* the desired number of times to drive the uni-tuned or coding circuit 15 to achieve the desired translation from frequency modulation to the cyclic progression code. Automatic frequency control is employed through feedback path 16** to stabilize the fixed frequency oscillator which will substantially maintain the intermediate center frequency constant.

As herebefore mentioned, coding circuit 15 accomplishes the translation of the FM signal to the cyclic progression code by employing a plurality of tuned circuits, the number of which corresponds to the number of digits present in the cyclic progression code. Each of these tuned circuits are so tuned that when the FM signal is beat with the proper number of fixed frequency oscillators, the desired number of pass bands for each digit is produced. The number of oscillators employed to produce the pass bands for a single digit corresponds to the number of pass bands present in that particular digit. The total number of oscillators employed in circuit 15 is determined by the maximum number of pass bands present in the last digit of the code. These oscillators are so arranged that means may be employed for selecting the desired number of oscillators, at the correct frequency, to produce the desired pass bands in the remaining digits. A detailed description of the operation of circuit 15 will follow hereinafter in connection with Fig. 4, a schematic diagram of coding circuit 15.

The frequency modulated signal is conducted to the tuned circuit 15 where a plurality of oscillators, such as crystal controlled oscillators, heterodyne in a predetermined manner with the frequency modulated signal. The signal levels of each digit, corresponding to established frequencies, are indicated by a single tuned circuit for each digit by the circuit resonance or non-resonance. The waveform produced by one digital tuned circuit is shown in curve E, Fig. 2, where the peak 17 corresponds to the resonance or frequency pass band for one particular signal level of a digit, say digit #5, while peaks or frequency pass bands 18 and 19 correspond to other levels of the same digit. To assure the production of a digit pulse corresponding to a predetermined signal frequency, it is desirous to sample the pass bands, such as 17, 18, and 19 of each digit, by sampler circuits 20 to produce a discrete digit pulse for each pass band of each digit as shown in curve F, representing a portion of a single digit. It will be understood, of course, that for any given signal level one or more digit circuits will respond to produce a digit pulse depending on the signal level and code signal for such level.

Pulses of curve F consist of a burst of instantaneous FM signal. Pulses of curve F are rectified by detector circuit 22 to obtain the discrete video pulses of curve G. Simultaneously from the digit detectors #1 to #4 a similar pulse is produced, all of which must be interleaved to provide a coded signal. This interleaving is accomplished by delay line 23 which provides a different period of delay for the signal pulses of different digits such that these signal pulses occupy their appropriate position in the coded signal. The cyclic progression code in this type of formation may contain different pulse amplitudes, due to the location of the pulse of a particular signal level with reference to a digit pass band, a variation which is unwanted in a cyclic progression code to a pulse code modulation translator due to the introduction of spurious outputs. Curve H, Fig. 2 represents two code signals for signal levels 25 mc. and 23 mc. As shown, digit pulses are present in digits #1, 2, and 5 while these pulses are absent from digits #3 and 4 of signal level indicated at 25 mc. in Fig. 3. The second code signal shown in curve H occurs at 23 mc. of Fig. 3 and indicates that pulses are present in digits #2 and 5 while pulses are absent from digits #1, 3, and 4. The varying amplitudes thereof may be evened off by employment of a single stability trigger circuit 24 which allows only a predetermined amplitude, say amplitude 21, to pass; above this amplitude the trigger circuit 24 is made operative and below this amplitude circuit 24 is inoperative. As a result thereof a train of constant amplitude pulses are produced as shown in curve I, corresponding to the coded level of curve H. For transmission over a pulse code modulation link system, the cyclic progression code may be translated to a pulse code modulation which may be accomplished by a double stability multivibrator 25, or any other circuit which will efficiently accomplish this desired translation.

A representation of a cyclic progression code is shown in Fig. 3 where the code comprises five digits having thirty-two signal levels for each digit. The shaded areas 26 indicate the presence of a pulse and the blank areas 27 indicate the absence of a pulse. To accomplish encoding of a frequency modulated signal having a known frequency range, it is necessary to assign frequencies to each code level. For descriptive purposes a range of frequencies from 16 to 32 mc. is chosen, and the frequencies assigned to each signal level are shown in Fig. 3. In previous frequency modulated, pulse code modulation coders, separate tuned circuits were required for each frequency band where output was desired. To obtain the code shown in Fig. 3, there would be needed sixteen such circuits, since the code contains sixteen shaded or pulse areas 26, each circuit therein would require careful adjustment of tuning and Q. This laborious adjustment problem led to the conception of the coding circuit 15, as indicated in the system of Fig. 1 and shown schematically in Fig. 4.

Figure 4:
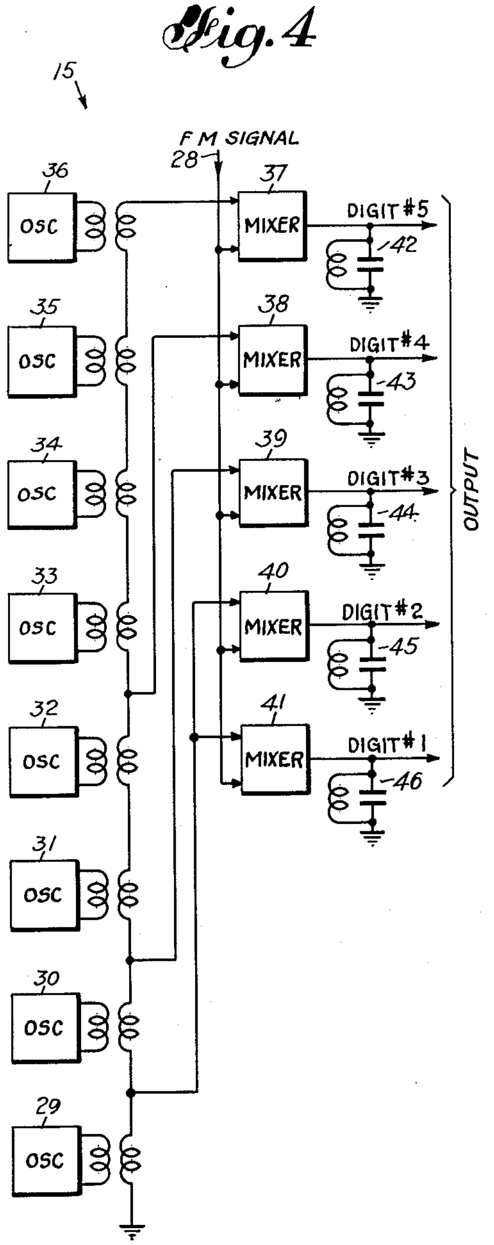
Fig. 4 is a schematic diagram of the uni-tuned circuit of Fig. 1 for handling a cyclic progression code of five digits in accordance with the principles of this invention.
Figure 5:
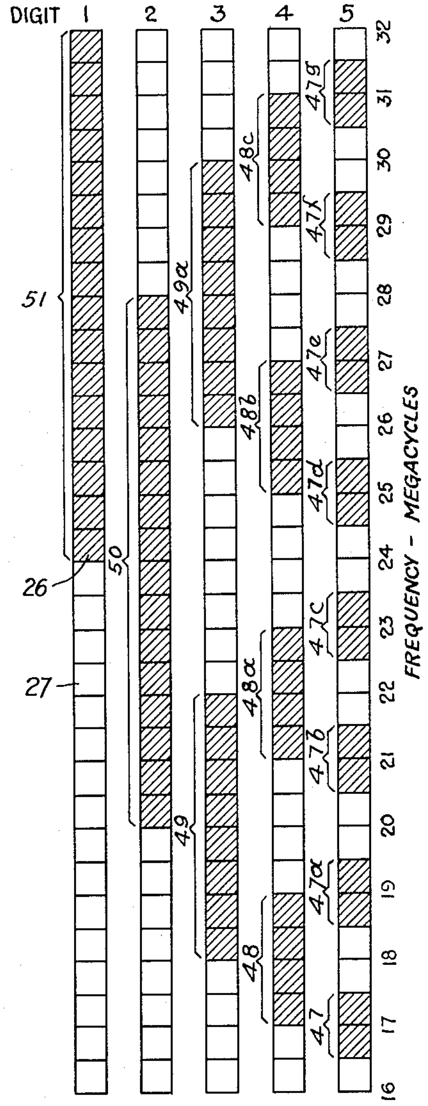

In Fig. 4 a frequency modulated signal is applied at terminal 28 and beat with the fixed oscillators 29—36, for instance, crystal controlled oscillators or any other complementary oscillator, such that the frequency band or levels where output is desired falls in the pass band of a single tuned circuit while the beats for the frequency bands or levels requiring no output fall outside the pass band. The beating process hereabove mentioned occurs in the mixer circuits 37—41 which contain circuity therein to pass the predetermined quantities, the sum or difference of the two signals mixed. Tuned circuits 42—46 are tuned in such a manner that a pulse output occurs where it should for that particular digit consistent with the cyclic progression code, shown in Fig. 3.

Scrutiny of Fig. 3 will show why only a single tuned circuit is required for each digit. The frequency bands 47, 48, 49, 50, and 51 in the various digits are of different width. A numerical example of production of a cyclic progression code from a frequency modulating signal will be given, using the frequency conditions established in Fig. 3 and assuming frequencies to which the various tuned circuits of Fig. 4 are tuned as follows: circuit 42 at 70 mc. with a bandwith of 1 mc., circuit 43 at 71 mc. with a bandwidth of 2 mc., circuit 44 at 73 mc. with a bandwidth of 4 mc., circuit 45 at 77 mc. with a bandwidth of 8 mc., and circuit 46 at 81 mc. with a bandwidth of 8 mc. For this example, the frequency of the fixed oscilaltors are 53 mc. for oscillator 29, 45 mc. for oscillator 30, 49 mc. for oscillator 31, 41 mc. for oscillator 32, 51 mc. for oscillator 33, 47 mc. for oscilaltor 34, 43 mc. for oscillator 35, 39 mc. for oscillator 36.

When the frequency modulated signal is presented simultaneously to mixers 37, 38, 39, 40, and 41, a selected number of fixed frequency signals from the oscillators 29—36 are presented to the various mixers to beat with the frequency modulated signal, and the sum of the beat frequencies is selected simultaneously by the digital tuned circuits. The pass bands 47, 47_a_, 47_b_, 47_c_, 47_d_, 47_e_, 47_f_, and 47_g_ of digit #5, as shown in Fig. 3, are produced by the beating of oscillator 29 and 17 mc. of the FM signal, oscillator 30 and 19 mc. of the FM signal, oscillator 31 and 21 mc. of the FM signal, oscillator 32 and 23 mc. of the FM signal, oscillator 33 and 25 mc. of the FM signal, oscillator 34 and 27 mc. of the FM signal, oscillator 35 and 29 mc. of the FM signal, and oscillator 36 and 31 mc. of the FM signal, respectively. The pass bands 48, 48_a_, 48_b_, and 48_c_ of digit #4 are produced by the beating of oscillator 29 and 18 mc. of the FM signal, oscillator 30 and 22 mc. of the FM signal, oscillator 31 and 26 mc. of the FM signal, and oscillator 32 and 30 mc. of the FM signal, respectively. To follow through the same considerations of passing the sum of frequencies produced by the beating of the fixed oscillator and the FM signal, we find that pass bands 49 and 49$a$ of digit #3 are produced by beating of oscillators 29 and 30, and 20 mc. and 28 mc. of the FM signal, respectively. The pass band 50 of digit #2 is produced by oscillator 29 and 24 mc. of the FM signal while pass band 51 of digit #1 is produced by oscillator 29 and 28 mc. of the FM signal.

Investigation of the above numerical values will show that the number of oscillators are selected from the total number of such oscillators to beat with the FM signal to produce the required number of digital pass bands consistent with the predetermined cyclic progression code. The sum of an individual oscillator frequency and some particular frequency through which the FM signal swings will add up to the frequency at which a digital tuned circuit may be tuned. Where more than one pass band is present in a digit, for instance four pass bands as in digit #4, the required number of proper oscillator-produced frequencies will combine with a like number of frequencies through which the FM signal swings producing different points in the FM signal where the beat frequency adds up to the frequency for which the digital tuned circuit is tuned, producing pass bands consistent with the cyclic progression code. If the FM signal should be such that it does not swing through the entire indicated frequency range, only that portion of the code through which it swings will be derived therefrom.

The uni-tuned circuit herein described like the superheterodyne receiver has its input beat to a fixed frequency band. The exact frequencies required to produce the various pass bands of the various digits can be chosen within limits based on the considerations herein enumerated. Other oscillator frequencies and adjustments of the tuned circuits are possible, but extreme care must be taken to prevent the combination of frequencies so chosen to produce spurious beats.

Although the advantages of this invention will be readily recognized by those skilled in the art, such as simplification of circuitry, ease of adjustment or operation, and economical on parts required, there are certain precautions to be considered. To enumerate, a high level output is required from the oscillators to obtain good mixing with the output therefrom independent of the oscillator signal level, and considerable care is required in choosing the heterodyne frequencies to avoid spurious beats or false coding. However, these are not detrimental to the operation of such a system if proper engineering procedure is followed.

It is conceivable from consideration of the circuit herein presented and recognizable principles thereof that such a circuit is easily expandable by the addition, in the required amounts and the proper relationship, of fixed oscillators, mixers, and tuned circuits to accomplish the desired encoding problem.

Although I have shown and described a certain specific embodiment of my invention, I am fully aware that many modifications thereof are possible. Therefore, this description is made by way of example and not as a limitation to the scope of my invention.

I claim:

1. A pulse code modulation coder comprising a frequency modulation signal source and a cyclic progression coding circuit, said coding circuit including a mixer for each digit incorporated in a cyclic progression code, a plurality of independent frequency sources, means to apply predetermined ones of said frequency sources to said mixers, means to apply signals from said signal source simultaneously to each of said mixers, a delay line having a plurality of input connections therealong and means connecting the outputs of said mixers to respective ones of said input connections to thereby interleave in time the outputs of said mixers, and means to convert the signal output of said mixers to pulse code signals.

2. A pulse code modulation coder comprising a frequency modulation signal source and a coding circuit, said coding circuit including a mixer for each digit incorporated in a cyclic progression code, a plurality of frequency sources, means to apply predetermined ones of said frequency sources to said mixers, means to apply signals from said signal source simultaneously to each of said mixers, and means to convert the signal output of said mixers to pulse code signals, said plurality of frequency sources include crystal controlled oscillators and said predetermined ones are applied to said mixers by means of conductors, the number to be applied to each of said mixers depending upon the number of pass bands present in each of said digits.

3. A coder according to claim 2, wherein the number of said frequency sources is equal to the maximum number of pass bands required for any one of said digits.

4. A coder according to claim 1 wherein said means to convert includes a tuned circuit for each of said digits disposed at the output of said mixers, and a double stability multivibrator to produce a corresponding pulse code modulation.

5. A coder according to claim 4, wherein the number of said tuned circuits is equal to the number of digits present in a predetermined cyclic progression code, said tuned circuits being adjusted to pass a desired number of pass bands incorporated in its corresponding code digit.

6. A frequency modulation to cyclic progression code translating circuit comprising a frequency modulation signal source, a plurality of oscillator circuits, a plurality of mixer circuits, and a plurality of tuned circuits, the maximum number of pass bands present in any one digit of a predetermined cyclic progression code determines the number of said oscillators, and the number of said mixers and said tuned circuits are determined by the number of said digits in said code.

7. A translating circuit according to claim 6, wherein the outputs of said oscillators are arranged in a series fashion and are coupled to impose the proper frequency and the proper number of such frequencies on said mixer circuits to produce from said input by heterodyning means the desired number of said pass bands in each of said digits, said tuned circuits being adjusted to cooperate with said mixer circuits to produce the required number of pass bands and bandwidth for each of said digits.

8. A translating circuit according to claim 6, wherein the deviation of said frequency modulation signal is some predetermined value, the said plurality of oscilators number eight, and the said plurality of tuned circuits number five, said oscillators being coupled so that the first two tuned circuits are coupled to the first oscillator, the third tuned circuit is coupled to the first two oscillators, the fourth tuned circuit is coupled to the first four oscillators, and the fifth tuned circuit is coupled to all eight oscillators, said tuned circuits having a bandwidth dependent upon the said deviation and the requirements of said code.

9. A cyclic progression modulation coder comprising a frequency modulation signal source, a mixer for each digit incorporated in a cyclic depression code, a plurality of independent frequency sources, means to apply predetermined ones of said frequency sources to said mixers, means to apply signals from said signal source simultaneously to each of said mixers, a delay line having a plurality of input connections therealong, and means connecting the outputs of said mixers to respective ones of said input connections to thereby interleave in time the outputs of said mixers.

References Cited in the file of this patent

UNITED STATES PATENTS

| | | |
|---|---|---|
| 2,560,434 | Gloess et al. | July 10, 1951 |
| 2,570,220 | Earp et al. | Oct. 9, 1951 |